(12) United States Patent
Chu

(10) Patent No.: US 7,015,625 B2
(45) Date of Patent: Mar. 21, 2006

(54) PIEZOELECTRIC DEVICES

(75) Inventor: Daping Chu, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 337 days.

(21) Appl. No.: 09/866,740

(22) Filed: May 30, 2001

(65) Prior Publication Data

US 2002/0017836 A1 Feb. 14, 2002

(30) Foreign Application Priority Data

May 31, 2000 (GB) .................................. 0013234

(51) Int. Cl.
*H01L 41/08* (2006.01)
(52) U.S. Cl. ..................................................... 310/328
(58) Field of Classification Search ................ 310/328, 310/339, 330, 331, 317, 358
See application file for complete search history.

(56) References Cited

U.S. PATENT DOCUMENTS

| | | | | |
|---|---|---|---|---|
| 2,347,098 A | * | 4/1944 | Green | 310/328 |
| 2,551,848 A | * | 5/1951 | Parker | 310/328 |
| 2,636,135 A | * | 5/1953 | Peek, Jr. | 310/321 |
| 2,834,943 A | * | 5/1958 | Grisdale | 310/328 |
| 2,945,192 A | * | 7/1960 | Szymanski | 310/328 |
| 3,683,211 A | * | 8/1972 | Perlman et al. | 310/326 |
| 3,754,214 A | * | 8/1973 | Matsumoto et al. | 361/172 |
| 4,096,756 A | * | 6/1978 | Alphonse | 310/317 |
| 4,586,377 A | * | 5/1986 | Schmid | 73/514.34 |
| 4,868,447 A | * | 9/1989 | Lee et al. | 310/328 |
| 5,410,205 A | * | 4/1995 | Gururaja | 310/321 |
| 5,485,053 A | | 1/1996 | Baz | |
| 5,537,863 A | | 7/1996 | Fujiu et al. | |
| 5,673,220 A | | 9/1997 | Gendlin | |
| 5,825,117 A | * | 10/1998 | Ossmann et al. | 310/317 |
| 6,215,227 B1 | * | 4/2001 | Boyd | 310/359 |
| 6,320,300 B1 | * | 11/2001 | Kaminski et al. | 310/317 |
| 6,614,144 B1 | * | 9/2003 | Vazquez Carazo | 310/359 |
| 6,800,985 B1 | * | 10/2004 | Baker et al. | 310/348 |
| 2002/0017836 A1 | | 2/2002 | Chu | |

FOREIGN PATENT DOCUMENTS

| | | | |
|---|---|---|---|
| GB | 1 382 326 | | 3/1972 |
| GB | WO94/02965 | * | 2/1994 |
| GB | 2 284 298 A | | 5/1995 |
| GB | 2 329 514 A | | 3/1999 |
| GB | 2362989 | | 12/2001 |
| JP | 4038866 | | 10/1992 |
| JP | 9-205029 A | * | 8/1997 |
| JP | 11017126 | | 1/1999 |
| WO | WO 92/06509 A1 | | 4/1992 |
| WO | WO 99/42282 A1 | | 8/1999 |

\* cited by examiner

*Primary Examiner*—Thomas M. Dougherty
(74) *Attorney, Agent, or Firm*—Oliff & Berridge, PLC

(57) ABSTRACT

A device comprising a layer of piezoelectric material and a layer of ferroelectric material clamped together such that a voltage applied to one layer results in a voltage being generated across the other layer. Examples are given of the implementation of analogue components such as an amplifier, a transformer, an inverter and a comparator. For the comparator, the device has a third layer of material clamped together with the other two layers, the third layer being a ferroelectric material.

18 Claims, 1 Drawing Sheet

PIEZOELECTRIC DEVICES

Figure 1:
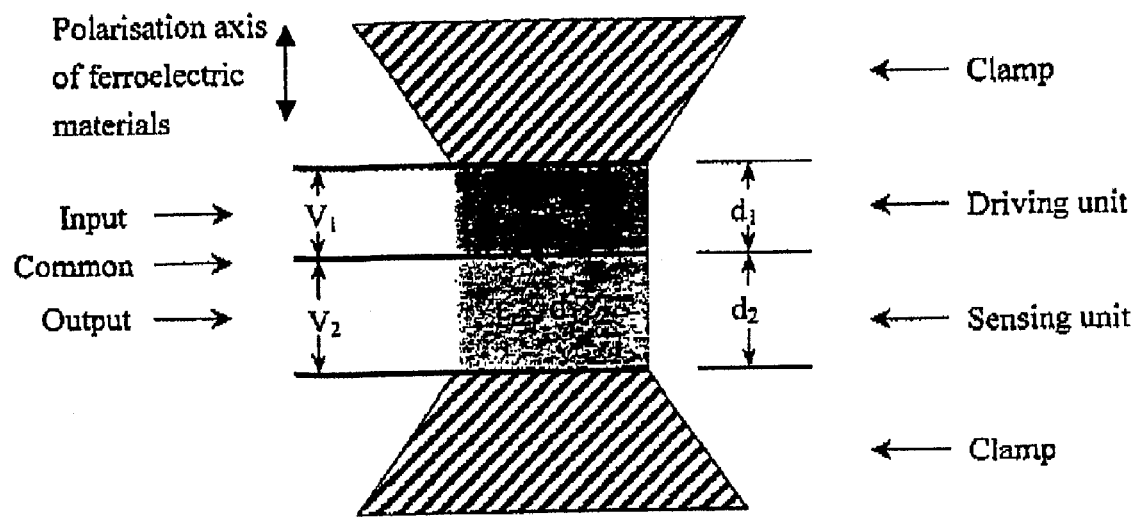

The present invention relates to devices which use piezoelectric materials in their structure.

It is well known that piezoelectric material will contract and elongate when an alternating electric field is applied. On the other hand, if such a material is subjected to alternated strains an electric field will be induced. This effect is used in a number of known devices.

There is a desire to extend the use of piezoelectric materials to the fabrication of other devices and the present invention has been made against this background.

According to the present invention there is provided a device comprising a layer of piezoelectric material and a layer of ferroelectric material clamped together such that a voltage applied to one layer results in a voltage being generated across the other layer.

If two pieces of piezoelectric material are clamped together and a voltage applied to one of them, an induced voltage can be measured from the other. The ratio of the applied voltage will depend upon the piezoelectric properties of the two materials and, possibly, sample geometry. A piezoelectric amplifier/transformer can be realised in this way using two layers of piezoelectric material. In ceramic piezoelectric materials the strain and corresponding electric field are in-phase.

Ferroelectric materials are a sub-set of piezoelectric materials. They can exhibit a non-volatile, bi-stable internal polarisation (generally, with respect to a particular crystal axis). The state of polarisation is established by the application of a voltage between opposing surfaces of the material. Having applied a sufficiently large voltage to internally polarise the material, it is subsequently possible to determine the direction of polarisation. This operation consists of applying a voltage to set the polarisation in a specified direction. If the polarisation is already in that direction no charge exchange is required. However, if the polarisation is in the opposite direction a relatively large amount of charge exchange is required to establish the specified direction of polarisation. Thus, the previous direction of polarisation can be judged according to the high or low (zero) level of charge exchange required to establish the specified polarisation.

In the present invention it has been found that a polarised ferroelectric material elongates or contracts when a weak external field (much less than the coercive force of the ferroelectric material) is applied in parallel or anti-parallel, respectively, to the polarisation. Consequently, the strains induced along the polarisation axis can be in-phase or out-of-phase to the applied AC external field, depending on the direction of polarisation. Either strain or electric field can be the primary driving force in the piezoelectric effect and they have a linear relationship to the first order. From this it has been recognised, in the present invention, that the phase of the induced electric field of a polarised ferroelectric material can be controlled by the direction of polarisation.

The concepts of the present invention have been found to be beneficial for the implementation of a range of devices including analogue devices such as amplifiers/transducers, inverters and comparators.

Figure 2:
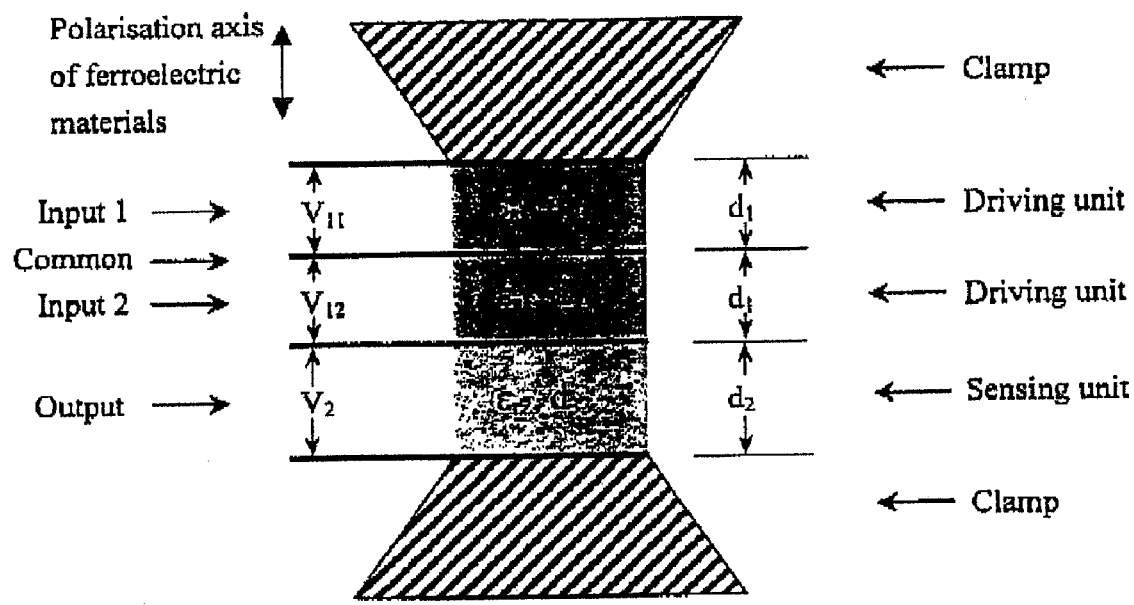

Embodiments of the present invention will now be described in more detail, by way of further example only and with reference to the accompanying drawings, in which:

FIG. 1 illustrates the structure of an amplifier/transducer according to a first embodiment of the present invention; and FIG. 2 illustrates the structure of a comparator according to another embodiment of the present invention.

A first embodiment of the present invention is the implementation of an amplifier/transducer, the structure of which is illustrated in FIG. 1.

A layer of polarised ferroelectric material can be used as a driving unit and apply an electric field to it as the input signal. The induced strain is then passed onto another layer of polarised ferroelectric material, the sensing unit. It induces a secondary electric field to provide the output signal. The magnification of the output depends on the properties of the materials used, while the phase of the signal is controlled by the arrangement of directions of polarisation in the two materials. Such a device acts as an amplifier or transformer with an extra degree of control on the phase of the output signal.

One structure to realise such an amplifier/transformer is to clamp these two units together along the polarisation axis, as shown in FIG. 1. The order of the units is not important.

Here the $\epsilon_{r,i}$, $d_{33,i}$, and $d_i$ are dielectric constant, piezoelectric coefficient and thickness of the material i, respectively. The strain of the material i, $S_{3,1}$, is simply: $S_{3,i}=d_{33,i} E_{3,i}$, where $E_{3,i}$ is the corresponding electric field component, and the stress is $T_{3,i}=S_{3,i}/S_{33,1}$. The subscript 3 indicates that the parameter concerned is the component along axis 3, the polarisation axis.

The performance of the device of FIG. 1 can be evaluated at two limits under hard-wall clamping conditions: (1) compressible limit; where the ferroelectric materials are regarded as compressible, which leads to ($d_1+d_2$=constant) at all times; (2) incompressible limit; when the ferroelectric materials are regarded as incompressible, which gives $T_{3,1}+T_{3,2}=0$ where $T_{3,i}$ is the stress in the material i. A real device should be working between these two limits.

At the compressible limit, we have $\Delta(d_1+d_2)=\Delta d_1+\Delta d_2=0$, and the induced change of the thickness at a given electric field is:

$$\Delta d_i(E_i) \equiv d_i(E_i) - d_i(0)$$

$$\approx S_{3,i} d_i(0)$$

$$= \pm d_{33,1} E_i d_i(0)$$

$$\approx \pm d_{33,1} V_1$$

where the sign +/− is chosen when the $E_i$ is parallel/anti-parallel to the direction of polarisation. Therefore, the output signal is:

$$V_2 = \mp \frac{d_{33,1}}{d_{33,2}} V_1 \qquad (1)$$

where the sign +/− shows that the input and output signals are in-phase/out-phase corresponding to anti-parallel/parallel polarisation between regions 1 and 2. The gain of the amplifier/transformer is $d_{33,1}/d_{33,2}$.

At the incompressible limit, we have $T_{3,1}+T_{3,2}=0$ and $T_{3,i}=-e_{33,i}E_{3,i}\approx-e_{33,i}V_i/d_i(0)$ where $e_{33,1}$ is another piezoelectric constant.

The output voltage shall be:

$$V_2 = \mp \frac{e_{33,1}}{e_{33,2}} \frac{d_2(0)}{d_1(0)} V_1 \qquad (2)$$

where again the signs correspond to parallel and anti-parallel polarisation between regions 1 and 2, respectively, and the gain of the device in this case is $e_{33,1}d_2(0)/e_{33,2}d_1(0)$.

To compare with the analysis of the previously suggested piezoelectric amplifier/transformer, (other than at the above two limits) it becomes apparent that $$T_{3,i} = c_{33,i} S_{3,i} = \pm c_{33,i} = d_{33,i} E_{3,i}$$

where $c_{33,i}$ is the elastic stiffness constant of the material i.

Since $E_{3,i} \approx V_i/d_1(0)$, the output can be expressed as:

$$V_2 = \mp \frac{c_{33,1}}{c_{33,2}} \frac{d_{33,1}}{d_{33,2}} \frac{d_2(0)}{d_1(0)} V_1 \quad (3)$$

To the approximation of only one component involved, we have $e_{33,i} = d_{33,i} c_{33,i}$ and find that Equation 3 is identical to Equation 2 obtained from the incompressible limit. From the same approximation, we can also have $c_{33,i} \, 1/s_{33,i}$ is the elastic compliance coefficient, and get:

$$V_2 = \mp \frac{d_{33,1}}{d_{33,2}} \frac{s_{33,2}}{s_{33,1}} \frac{d_2(0)}{d_1(0)} V_1 \quad (4)$$

Variation of the first embodiment leads to the implementation of an inverter. That is, when the properties and geometry of the materials concerned are chosen in such a way that the gain of the amplifier is unity, the device works as a inverter in the configuration of parallel polarisation.

Another embodiment of the present invention is the implementation of a comparator. If two identical driving units and one sensing unit are clamped together in the same way, it is possible to build up a comparator as shown in FIG. 2. The order of the units is again not important, if the input signals and output signal do not refer to one another. Otherwise, the arrangement as shown in FIG. 2 should be used. Besides, non-identical driving units can be used for special situations.

The performance of the comparator can be analysed in the same way as stated above in relation to the first embodiment. At the two limits, we now have: (1) $\Sigma d_1$=constant; (2) $(T_{3,11} + T_{3,12}) + T_{3,2} = 0$ if we assume that there is no interference between the two driving units. This assumption does affect the following conclusions drawn for the comparator.

In the first case, because $\Sigma \Delta d_1 = 0$, we have:

$$\pm V_2 = -\frac{d_{33,1}}{d_{33,2}} (\pm V_{11} + \pm V_{12}) \quad (5)$$

where the signs refer to the applied field is parallel or anti-parallel to the corresponding polarisation.

Similarly, for the second case, we have $$\pm V_2 = -\frac{d_{33,1}}{d_{33,2}} \frac{s_{33,2}}{s_{33,1}} \frac{d_2(0)}{d_1(0)} (\pm V_{11} + \pm V_{12}) \quad (6)$$

By arranging the directions of polarisation in the driving units as anti-parallel/parallel, we see the output of the device reduces to zero as the two input signals reach the same level when they are in-phase/out-phase.

In above, we assumed the devices are working at a constant temperature and did not take into account of the possible pyroelectric effect. In addition, we simplified the relations among electric field E, strain S and stress T. In general, they are coupled together in the form of $E + \beta S + \gamma T = 0$ to the first order. Detailed analysis and expressions can be found in standard texts relating to piezoelectric materials.

The clamping itself, apart from using clamps, can be realized by using two pieces of thick material (such as substrate) on each side of the device. The inertia of such a material will act as some kind of clamp, which should be particularly effective for a fast input signal or an input pulse supplied by a suitable device for providing such a signal or pulse.

It is not necessary to clamp the driving and sensing units together directly. They can be separated from each other and connected by incompressible solid or liquid. In this case, the device can work in the same fashion as if they were clamped together directly.

Piezoelectric ceramics can be used in the sensing unit for the comparator and the signs in front of $V_2$ in Equations (5) and (6) will disappear in this case. Besides, piezoelectric ceramics instead of ferroelectric material can be used in any one of the two units in FIG. 1. The signs in Equations (1) and (2) shall change accordingly.

The common electrode described in FIG. 1 can be used as a common ground for both input and output signal. Alternatively, it can be used as a ground electrode only for one unit so that the corresponding signal will float on the other one. For example, the output signal can be floating on the input signal. Same argument applies to the comparator.

The clamped device described here should be affected very little by external disturbances, as long as the scale of the device concerned is much smaller than the wavelength of the acoustic wave. The internal and relative displacements during the piezoelectric operation can be analogised to the optical mode of phonons, while the external disturbance, e.g. vibrations, to the acoustic mode which should have very little impact on our output.

The foregoing description has been given by way of example only and it will be appreciated by a person skilled in the art that modifications can be made without departing from the scope of the present invention.

The invention claimed is:

1. A device, comprising:
   a first layer that includes a piezoelectric material; and
   a second layer that includes a ferroelectric material;
   the first layer and the second layer being stacked along a direction,
   the second layer having a polarization axis along the direction,
   one layer of the first layer and the second layer receiving an input signal, and
   the other layer of the first layer and the second layer outputting an output signal according to the input signal.

2. The device according to claim 1,
   the device functioning as an amplifier.

3. The device according to claim 1,
   the device functioning as a transformer.

4. The device according to claim 1,
   the device functioning as an inverter.

5. The device according to claim 1, further comprising:
   a common electrode that is provided between the first layer and the second layer;
   an input electrode; and
   an output electrode,
   the first layer and the second layer being disposed between the input electrode and the output electrode.

6. The device as claimed in claim 1, further comprising a further layer of ferroelectric material.

7. The amplifier as claimed in claim 2, wherein a common electrode is provided between the first layer and the second layer, an input electrode is provided on one of the first layer and the second layer, and an output electrode is provided on the other of the first layer and the second layer, the input and output electrodes being disposed on opposite sides of their respective layers compared with the common electrode.

8. The amplifier as claimed in claim 7, wherein the input electrode is arranged on the second layer.

9. The transformer as claimed in claim 3, wherein a common electrode is provided between the first layer and the second layer, an input electrode is provided on one of the first layer and the second layer, and an output electrode is provided on the other of the first layer and the second layer, the input and output electrodes being disposed on opposite sides of their respective layers compared with the common electrode.

10. The transformer as claimed in claim 9, wherein the input electrode is arranged on the second layer.

11. The inverter as claimed in claim 4, wherein a common electrode is provided between the first layer and the second layer, an input electrode is provided on one of the first layer and the second layer, and an output electrode is provided on the other of the first layer and the second layer, the input and output electrodes being disposed on opposite sides of their respective layers compared with the common electrode.

12. The inverter as claimed in claim 11, wherein the input electrode is arranged on the second layer.

13. The device as claimed in claim 5, wherein the input electrode is arranged on the second layer.

14. A comparator, comprising:
   a first layer that includes a piezoelectric material layer;
   a second layer that includes a ferroelectric material layer; and
   a third layer that includes a ferroelectric material,
   the first layer, the second layer, and the third layer being stacked along a direction,
   the second layer having a polarization axis along the direction,
   one layer of the first layer and the second layer receiving an input signal, and
   the other layer of the first layer and the second layer outputting an output signal according to the input signal.

15. The comparator as claimed in claim 14, wherein a first input electrode is provided on one of the first layer, the second layer, and the third layer, a second input electrode is provided on another of the first layer, the second layer, and the third layer, a common electrode is provided between the one of the layers and the another of the layers having the input electrodes, and an output electrode is provided on the third layer, the input electrodes being disposed on opposite sides of their respective layers compared with the common electrode.

16. A method of operating the comparator as claimed in claim 14, the method comprising:
   applying a signal to set the polarization in the ferroelectric second layer to a predetermined direction; and
   causing an output signal from the ferroelectric third layer having a magnitude proportional to the sum or the difference of the magnitude of the respective input signals.

17. A method of operating a device having a first layer that includes a piezoelectric material and a second layer that includes a ferroelectric material, the first layer and the second layer being stacked along a direction, the second layer having a polarization axis along the direction, the method comprising:
   inputting an input signal to one layer of the first layer and the second layer; and
   outputting an output signal according to the input signal to the other layer of the first layer and the second layer.

18. The method as claimed in claim 17, wherein the input signal is applied to the ferroelectric material.

* * * * *